United States Patent
Kato

(10) Patent No.: US 7,292,133 B2
(45) Date of Patent: Nov. 6, 2007

(54) RESISTANCE CIRCUIT, AND VOLTAGE DETECTION AND CONSTANT VOLTAGE GENERATING CIRCUITS INCORPORATING SUCH RESISTANCE CIRCUIT

(75) Inventor: Hidenori Kato, Kobe (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/529,179

(22) Filed: Sep. 28, 2006

(65) Prior Publication Data

US 2007/0075825 A1    Apr. 5, 2007

(30) Foreign Application Priority Data

Sep. 30, 2005 (JP) ............... 2005-286123

(51) Int. Cl.
*H01C 10/00* (2006.01)

(52) U.S. Cl. ............... 338/195; 338/254; 338/320

(58) Field of Classification Search ............... 338/195, 338/254, 260, 319–320, 295
See application file for complete search history.

(56) References Cited

U.S. PATENT DOCUMENTS

| | | | | |
|---|---|---|---|---|
| 4,146,867 A | * | 3/1979 | Blangeard et al. | ............ 338/195 |
| 5,206,623 A | * | 4/1993 | Rochette et al. | ............ 338/203 |
| 5,291,174 A | * | 3/1994 | Zirnheld et al. | ............ 338/24 |
| 5,432,630 A | * | 7/1995 | Lebby et al. | ............ 398/116 |
| 6,229,428 B1 | * | 5/2001 | Lai | ............ 338/195 |
| 6,556,123 B1 | * | 4/2003 | Iwao et al. | ............ 338/22 R |

FOREIGN PATENT DOCUMENTS

| | | |
|---|---|---|
| JP | 8-124729 | 5/1996 |
| JP | 2003-37179 | 2/2003 |

\* cited by examiner

*Primary Examiner*—K. Richard Lee
(74) *Attorney, Agent, or Firm*—Cooper & Dunham, LLP

(57) ABSTRACT

A resistance circuit included in a semiconductor apparatus, which is formed of a plurality of thin film metal resistors connected in series, capable of achieving a precise resistance adjustment over a wide range by disconnecting or changing the resistors by laser beam irradiation. With three thin film metal resistors R1, R2, and R3 connected in series, for example, each having resistance adjustable ranges $\Delta R1$, $\Delta R2$, and $\Delta R3$, resistance adjustment accuracies $R1\_step$, $R2\_step$, and $R3\_step$, and the total resistance adjustable range $\Delta R0$ specified by the relation $\Delta R0 = \Delta R1 + \Delta R2 + \Delta R3$, the resistance circuit is formed to satisfy relational expressions, $R1\_step \leq \Delta R2$, $R2\_step \leq \Delta R3$, and $R3\_step \leq 0.001 \times \Delta R0 < R2\_step \leq 0.01 \times \Delta R0 < R1\_step \leq 0.1 \times \Delta R0$. This resistance circuit is suitably incorporated into high precision constant voltage generating, and voltage detecting circuits.

18 Claims, 10 Drawing Sheets

RESISTANCE CIRCUIT, AND VOLTAGE DETECTION AND CONSTANT VOLTAGE GENERATING CIRCUITS INCORPORATING SUCH RESISTANCE CIRCUIT

FIELD OF DISCLOSURE

This disclosure relates generally to resistance circuits included in semiconductor apparatuses, and more particularly to a resistance circuit, formed of a plurality of thin film metal resistors connected in series, capable of achieving a precise resistance adjustment by disconnecting or changing the resistors by laser beam irradiation.

BACKGROUND

In increasingly wide spread applications of integrated analogue circuitry such as constant voltage generating, and voltage detecting circuits, the adjustment of generated voltages or detected voltages with high precision is of great importance.

In order to provide such adjustments to the conditions of the circuitry, laser beam trimming techniques are utilized after completing circuit fabrication such that the resistors and fuse elements are irradiated with a laser beam to be subjected to the resistor disconnection or characteristic change through the irradiation.

Among various types of the resistors, thin film metal resistors are attracting much attention for their low thermal coefficients of the resistance value (TCR).

Suitable examples of the materials for forming the resistors include chromium silicon (CrSi), nickel chromium (NiCr), tantalum nitride (TaN), chromium silicide ($CrSi_2$), chromium nitrogen silicide (CrSiN), and chromium silicon oxide (CrSiO).

By irradiating directly with a laser beam, the thin film metal resistors undergo the resistor disconnection or characteristic change, and resistance values of the resistors can be adjusted.

Moreover, it is feasible to make the laser beam scanned over the area of the thin film metal resistors and to perform resistance adjustment (trimming) while measuring voltage outputs, for example, of fabricated circuit (which is generally called as on-line trimming). The on-line trimming of the thin film metal resistors yields an advantage of achieving a precision adjustment over a wide range of the resistance.

The adjustment of circuit parameters of the constant voltage generating circuit and voltage detecting circuit is carried out in general by properly adjusting a resistance ratio of a dividing resistance circuit included in the abovementioned circuits.

For example, as to the dividing resistance circuit formed of thin film metal resistors, a known resistance circuit is formed including a ladder trimming resistor 31 and an analog trimming resistor 33 in combination as illustrated in FIG. 10.

Thereafter, by irradiating the resistance circuit with a laser beam along a first beam locus 35a as shown in FIG. 10 to cause a resistor disconnection or characteristic change over an arbitrary number of the thin film metal resistor 33, a coarse adjustment is carried out of resistance value.

In the next place, by further irradiating the resistance circuit along a second beam locus 35b to cause a resistor disconnection or characteristic change over arbitrary regions on the thin film metal resistor 33, a desired series resistance value can be obtained with high precision (For example, Japanese Laid-Open Patent Application No. 8-124729).

In the resistance circuit formed of resistors with the ladder type arrangement as shown in FIG. 10, the resistance adjustment is carried out in general by performing (1) a coarse adjustment by trimming the ladder trimming resistor 31 as illustrated in FIG. 11A, and subsequently (2) a high precision adjustment over a partial region by trimming the analog trimming resistor 33 as illustrated in FIG. 11B.

In the trimming of the analog trimming resistor 33, however, the range of resistance subjected to the adjustment is relatively narrow.

As a result, several difficulties may be encountered in that the high precision adjustment cannot be feasible by the analogue trimming continuously over the regions covered by several coarse adjustments without the increases in (1) the number of the thin film metal resistors 31a in the ladder trimming resistor 31, (2) the area of resistor layout, or (3) trimming time.

In addition, another dividing resistance circuit is disclosed, as illustrated in FIG. 12, including an Rbottom resistor, (m+1) resistors SB0, SB1, . . . , SBm, with m being a positive integer, and an Rtop resistor, which are connected in series. In addition, the resistors SB0, SB1, . . . , SBm are respectively accompanied by corresponding fuse elements (or fuses) RL0, RL1, . . . , RLm connected in parallel with respect to the resistors, respectively, (For example, Japanese Laid-Open Patent Application No. 2003-37179).

In such dividing resistance circuit, a desired series resistance can be obtained by disconnecting arbitrary fuse elements RL0, RL1, - - -, RLm by a laser beam irradiation, for example (which is called conventionally as the digital trimming).

In the dividing resistance circuit of FIG. 12, it is possible to obtain a wide range of resistance adjustment by constituting the resistors each having binary resistance values (such as R, R/2, R/4, etc).

FIGS. 13A and 13B are graphical plots of resistance values as a function of the number of trimming step in the digital trimming for the dividing resistance circuit.

FIG. 13A plots the overall change in resistance values with the number of trimming steps, while FIG. 13B shows an expanded drawing for the portion of FIG. 13A ranging from the trimming steps 390 to 410 comparing the values obtained in practice with those by computation.

In the addition, the ten-bit code ranging from one through 1024 is adopted to the trimming steps of FIGS. 13A and 13B.

It should be noted that the digital trimming is performed such that the resistance values are measured only after completing the wafer fabrication and that the trimming of fuses are carried out according to the results of the resistance measurement, that is, the resistance adjustment through the off-line trimming.

As a result, the accuracy of the voltage output is considerably affected by the scattering in resistor characteristics caused by process fluctuation (FIG. 13B) This has given rise to another difficulty in achieving a high precision trimming of the dividing resistance circuit.

SUMMARY

Accordingly, it is an object of this disclosure to provide a resistance circuit included in a semiconductor apparatus, having most, if not all, of the advantages and features of similar employed circuits, while eliminating many of the aforementioned disadvantages.

It is another object to provide a resistance circuit, formed of a plurality of thin film metal resistors connected in series, capable of achieving an resistance adjustment over a wide range with a high precision by disconnecting or changing at least one of the plurality of resistors by laser beam irradiation.

The present disclosure provides a semiconductor apparatus including at least a resistance circuit which is formed of a plurality of resistors connected in series such that the resistance of the plurality of resistors can be adjusted by disconnecting, or changing characteristics of, at least one of the plurality of resistors through a laser beam irradiation.

In addition, the resistance circuit is provided with three or more thin film metal resistors connected in series, in which the plurality of resistors are formed so as to satisfy a relational expression, $\Delta Rn \geq R(n-1)\_step$, where $\Delta Rn$ is a resistance adjustable range for an n-th thin film metal resistor with n being an integer of two or greater, and $R(n-1)\_step$ is a resistance adjustment accuracy for an (n-1)th thin film metal resistor.

In another aspect, the semiconductor apparatus can be provided with three thin film metal resistors Ra, Rb, and Rc, as the abovementioned three or more thin film metal resistors connected in series, so as to satisfy relational expressions, $Ra\_step \leq 0.1 \times \Delta R0$, $Rb\_step \leq 0.01 \times \Delta R0 < Ra\_step$, and $Rc\_step \leq 0.001 \times \Delta R0 < Rb\_step$, where Ra_step, Rb_step, and Rc_step are resistance adjustment accuracies for the thin film metal resistors Ra, Rb, and Rc, respectively, and $\Delta R0$ is the total resistance adjustable range specified by the relational expression, $\Delta R0=\Delta Ra+\Delta Rb+\Delta Rc$, with $\Delta Ra$, $\Delta Rb$, and $\Delta Rc$ being resistance adjustable ranges for the resistors Ra, Rb, and Rc, respectively.

In still another aspect, a semiconductor apparatus is disclosed including at least a dividing resistor circuit for generating an output voltage through voltage division by two or more thin film metal resistors and for adjusting the output voltage by irradiating a laser beam onto at least one of the thin film metal resistors, in which the dividing resistor circuit includes one of the resistance circuits respectively comprising (a) three or more thin film metal resistors connected in series, and (b) three thin film metal resistors Ra, Rb, and Rc.

In another aspect, a semiconductor apparatus is disclosed including at least a voltage detecting circuit provided with a dividing resistor circuit, a reference voltage generating circuit, and a comparison circuit, in which the dividing resistor circuit includes one of the abovementioned resistance circuits.

In another aspect, a semiconductor apparatus is disclosed including at least a constant voltage generating circuit provided with an output driver, a dividing resistor circuit, a reference voltage generating circuit, and a comparison circuit, in which the dividing resistor circuit includes one of the abovementioned resistance circuits.

BRIEF DESCRIPTION OF THE DRAWINGS

The present disclosure and features and advantages thereof will be more readily apparent from the following detailed description and appended claims couple with the drawings.

DESCRIPTION OF THE PREFERRED EMBODIMENTS

Figure 1:
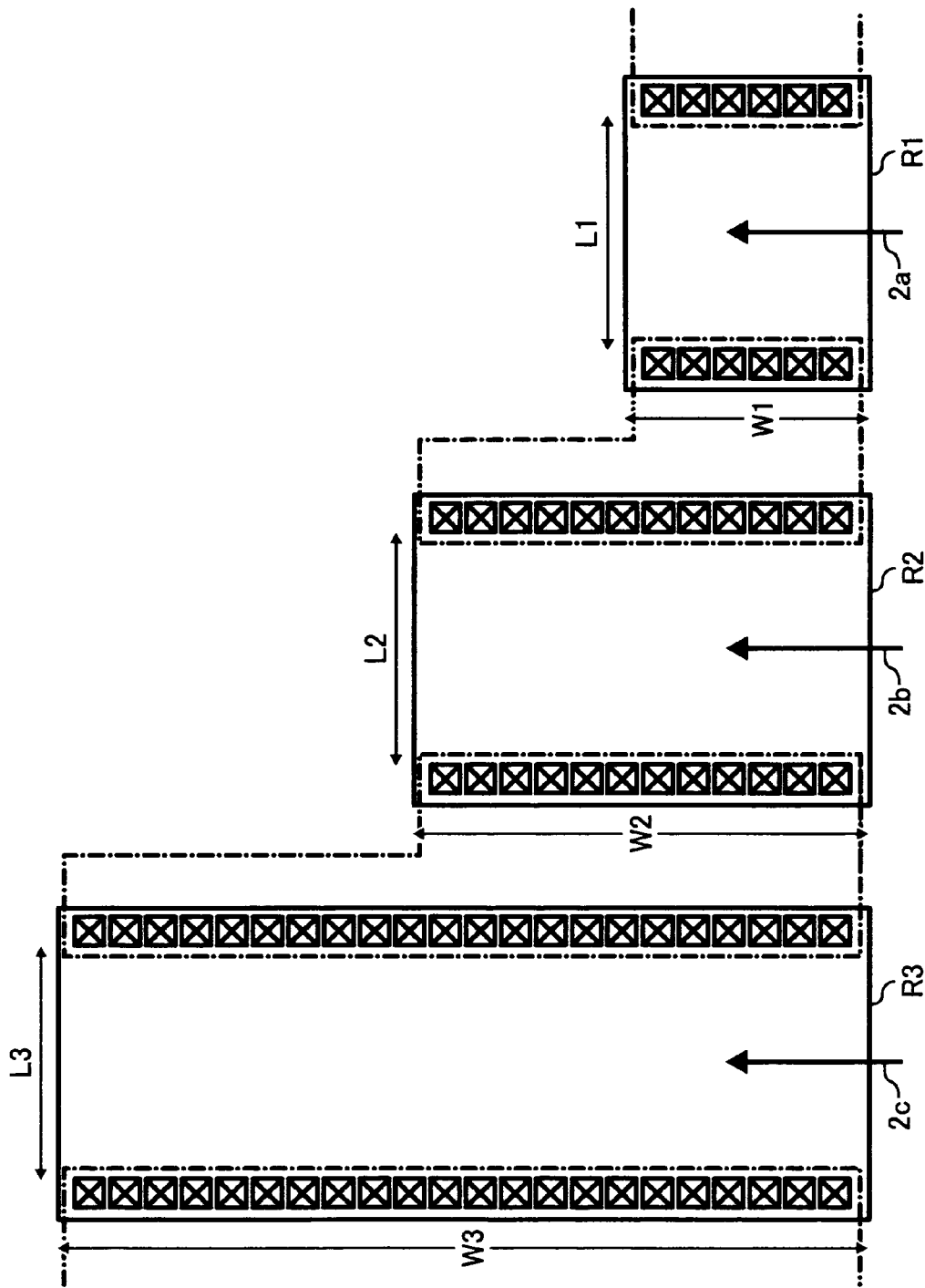
FIG. 1 is a diagrammatic plan view illustrating a resistance circuit according to one embodiment of the present disclosure.

In the detailed description which follows, specific embodiments of resistance circuits are described with respect to precise resistance adjustment. It is understood, however, that the present disclosure is not limited to these embodiments. For example, the use of the resistance circuit disclosed herein may also be adaptable to any form of electronic circuits and systems. Other embodiments will be apparent to those skilled in the art upon reading the following description.

A resistance circuit incorporated into a semiconductor apparatus, which is formed of a plurality of resistors connected in series such that the resistance of the plurality of resistors can be adjusted by disconnecting, or changing characteristics of, at least one of the plurality of resistors through a laser beam irradiation.

In addition, the resistance circuit is provided with three or more thin film metal resistors connected in series, in which the plurality of resistors are formed so as to satisfy a relation, $\Delta Rn \geq R(n-1)\_step$, where $\Delta Rn$ is a resistance adjustable range for an n-th thin film metal resistor with n being an integer of two or greater, and $R(n-1)\_step$ is a resistance adjustment accuracy for an (n−1)th thin film metal resistor.

With the present configuration of the resistance circuit satisfying the above noted relation, the resistance values can be adjusted continuously over a wide region in particular with high precision covering coarse adjustment regions.

It may be added in this context (1) by the term, resistance adjustable range, is meant the difference of the resistance between after the trimming and initial resistance for each of the thin film metal resistors, (2) the ladder trimming resistors are the resistors in which plural regions therein to be subjected to laser beam irradiation are formed in ladder-shaped in parallel with each other, (3) the resistance adjustable range represents the change in resistance value caused either by the disconnection, or change of one laser beam irradiation region for the ladder trimming resistors, or by one laser irradiation for the on-line trimming resistors, and (4) the order "n-th" of the resistor is represented according to the order of the resistors by not in the present serial connection but in the degree of coarseness of the resistance adjustment accuracy.

In another aspect, the semiconductor apparatus is provided with three thin film metal resistors Ra, Rb, and Rc, as the abovementioned three or more thin film metal resistors connected in series, so as to satisfy relational expressions, $Ra\_step \leq 0.1 \times \Delta R0$, $Rb\_step \leq 0.01 \times \Delta R0 < Ra\_step$, and $Rc\_step \leq 0.001 \times \Delta R0 < Rb\_step$, where Ra_step, Rb_step, and Rc_step are resistance adjustment accuracies for the thin film metal resistors Ra, Rb, and Rc, respectively, and $\Delta R0$ is the total resistance adjustable range specified by the relational expression, $\Delta R0 = \Delta Ra + \Delta Rb + \Delta Rc$, with $\Delta Ra$, $\Delta Rb$, and $\Delta Rc$ being resistance adjustable ranges for the resistors Ra, Rb, and Rc, respectively.

Since the relation, Ra_step>Rb_step>Rc_step, is found in the present embodiment, the resistors Ra, Rb, and Rc correspond to the abovementioned first, second, and third resistors, respectively.

The resistance adjustment therefore becomes feasible in the thin film metal resistors Ra, Rb, and Rc with the precision of less than $\frac{1}{100}$, $\frac{1}{100}$, and $\frac{1}{1000}$ of the total resistance adjustable range $\Delta R0$, respectively.

Moreover, the thin film metal resistors Ra, Rb, and Rc in the present embodiment may be on-line trimming resistors. Alternatively, the thin film metal resistor Ra is a ladder trimming resistors, while the resistors Rb and Rc are on-line trimming resistors.

In still another aspect, a semiconductor apparatus includes at least a dividing resistor circuit for generating an output voltage through voltage division by two or more thin film metal resistors and for adjusting the output voltage by irradiating a laser beam onto at least one of the thin film metal resistors, in which the dividing resistor circuit includes one of the resistance circuits respectively comprising a) three or more thin film metal resistors connected in series, wherein the plurality of resistors are formed so as to satisfy a relational expression, $\Delta Rn \geq R(n-1)\_step$, where $\Delta Rn$ is a resistance adjustable range for an n-th thin film metal resistor with n being an integer of two or greater, and $R(n-1)\_step$ is a resistance adjustment accuracy for an (n−1)th thin film metal resistor, and b) a first thin film metal resistor Ra, a second thin film metal resistor Rb, and a third thin film metal resistor Rc, as the abovementioned three or more thin film metal resistors, wherein the first, second, and third thin film metal resistors Ra, Rb, and Rc are formed so as to satisfy relational expressions, $Ra\_step \leq 0.1 \times \Delta R0$, $Rb\_step \leq 0.01 \times \Delta R0 < Ra\_step$, and $Rc\_step \leq 0.001 \times \Delta R0 < Rb\_step$, where Ra_step, Rb_step, and Rc_step are resistance adjustment accuracies for the first, second, and third thin film metal resistors Ra, Rb, and Rc, respectively, and $\Delta R0$ is a total resistance adjustable range specified by a relational expression, $\Delta R0 = \Delta Ra + \Delta Rb + \Delta Rc$, with $\Delta Ra$, $\Delta Rb$, and $\Delta Rc$ being resistance adjustable ranges for the first, second, and third thin film metal resistors Ra, Rb, and Rc, respectively.

With the resistance circuit, therefore, the resistance values can be adjusted with high precision over a wide range of resistance adjustment and the precision of the voltage output from the dividing resistor circuit is improved.

In another aspect, a semiconductor apparatus includes at least a voltage detecting circuit provided with (1) a dividing resistor circuit configured to generate a divided voltage by dividing an input voltage, (2) a reference voltage generating circuit configured to supply a reference voltage, and (3) a comparison circuit configured to make a comparison between the divided voltage generated by said dividing resistor circuit and the reference voltage supplied by said reference voltage generating circuit, in which the dividing resistor circuit includes one of the resistance circuits, as mentioned above, respectively comprising (a) three or more thin film metal resistors connected in series, and (b) three thin film metal resistors Ra, Rb, and Rc.

In another aspect, a semiconductor apparatus includes at least a constant voltage generating circuit provided with (1) an output driver configured to control an output voltage corresponding to an input voltage, (2) a dividing resistor circuit configured to supply a divided voltage by dividing the output voltage, (3) a reference voltage generating circuit configured to supply a reference voltage, and (4) a comparison circuit configured to make a comparison between the divided voltage generated by said dividing resistor circuit and the reference voltage supplied by said reference voltage generating circuit and to control an operation of said output driver according to a result of the comparison, in which the dividing resistor circuit includes one of the resistance circuits, as mentioned above, respectively comprising (a) three or more thin film metal resistors connected in series, and (b) three thin film metal resistors Ra, Rb, and Rc.

With the above configuration of the resistance circuit included in the voltage detecting circuit, the precision of the voltage output from the dividing resistor circuit can be improved and the precision of voltage detecting capability with the voltage detecting circuit is also improved.

Similarly, with the resistance circuit included in the constant voltage generating circuit, the precision of the voltage output from the dividing resistor circuit can be improved and the output voltage with the constant voltage generating circuit is thereby highly stabilized.

Having described the present disclosure in general, the features of the resistance circuits and electronic units incorporating such circuits will be detailed herein below according to several embodiments of the present disclosure.

FIG. 1 is a diagrammatic plan view illustrating a resistance circuit according to one embodiment of this disclosure.

Although several transistor devices, capacitive elements, etc. are also formed on the same substrate and the description on these devices is made in the following discussion, they are not shown in the drawings for purposes of clarity.

Referring to FIG. 1, thin film metal resistors R1, R2, and R3 are formed each consisting substantially of CrSi, for example, on a silicon substrate with an intervening insulating layer therebetween. The thin film metal resistors are hereinafter referred to as "resistors."

The resistors R1, R2, and R3 are formed as on-line trimming resistors of L1, L2, and L3 in length (L1=L2=L3 in the present embodiment) and W1, W2, and W3 in width (W1<W2<W3), respectively.

The resistors R1, R2, and R3 are subjected to laser irradiation as indicated by the arrows 2a, 2b, and 2c in FIG. 1, respectively.

Incidentally, the resistors R1, R2, and R3 correspond to the aforementioned resistors Ra, Rb, and Rc in the resistance circuit of the disclosure.

An interlayer insulating layer is further formed over the structure including resistors R1, R2, and R3.

Contact holes are formed on the interlayer insulating layer corresponding to respective edge portions in the longitudinal direction of the resistors R1, R2, and R3.

In addition, a metal wiring layer is formed on the interlayer insulating layer including the regions in which the contact holes were formed, as designated by dashed dotted lines in FIG. 1, so that the resistors R1, R2, and R3 are connected in series by the metal wiring layer.

Assuming that initial resistances to be R10, R20, and R30, and resistance adjustable ranges to be $\Delta R1$, $\Delta R2$, and $\Delta R3$, for the resistors R1, R2, and R3, respectively, the total maximum resistance R0_total and the total maximum resistance Rtmax_total after trimming are expressed by $$R0\_total = R10 + R20 + R30 \quad (1)$$

$$Rtmax\_total = (R10 + \Delta R1) + (R20 + \Delta R2) + (R30 + \Delta R3). \quad (2)$$

In addition, the total resistance adjustment range $\Delta R0$ is expressed by $$\Delta R0 = \Delta R1 + \Delta R2 + \Delta R3 \quad (3).$$

Moreover, there provided herein are resistance adjustable ranges $\Delta R1$, $\Delta R2$, and $\Delta R3$, and a resistance adjustment accuracy R_step (the magnitude of resistance change per one shot of laser irradiation) as follows.

Namely, $$R1\_step = \Delta R0 \div 10 \quad (4),$$

$$\Delta R1 = 9 \; shots \times \Delta R0 \div 10 \quad (5),$$

$$R2\_step = \Delta R0 \div 100 \quad (6),$$

$$\Delta R2 = 9 \; shots \times \Delta R0 \div 100 \quad (7),$$

$$R3\_step = \Delta R0 \div 1000 \quad (8), \text{ and}$$

$$\Delta R3 = 10 \; shots \times \Delta R0 \div 1000 \quad (9).$$

With this configuration fine tunings can be performed such as the 1/10 adjustment of the total resistance adjustment range $\Delta R0$ by means of the resistor R1, 1/100 adjustment by the resistor R2, and 1/1000 adjustment by the resistor R3.

Since the resistance adjustment by the trimming of the resistors R1, R2, and R3 can be performed independently, the resistance resulting from the configuration is obtained from the expressions (3), (5), (7), and (9) as $$\Delta R0 = 9 \times \Delta R0 \div 10 + 9 \times \Delta R0 \div 100 + 10 \times \Delta R0 \div 1000 \quad (10)$$

$$= 1000 \div 1000 \times \Delta R0.$$

With the abovementioned resistance circuit, therefore, the resistance adjustment can be performed in the order of magnitude of 1/1000 of $\Delta R0$. As a result, the resistance adjustment becomes possible having a high precision and a wide range of the adjustment.

Figure 2:
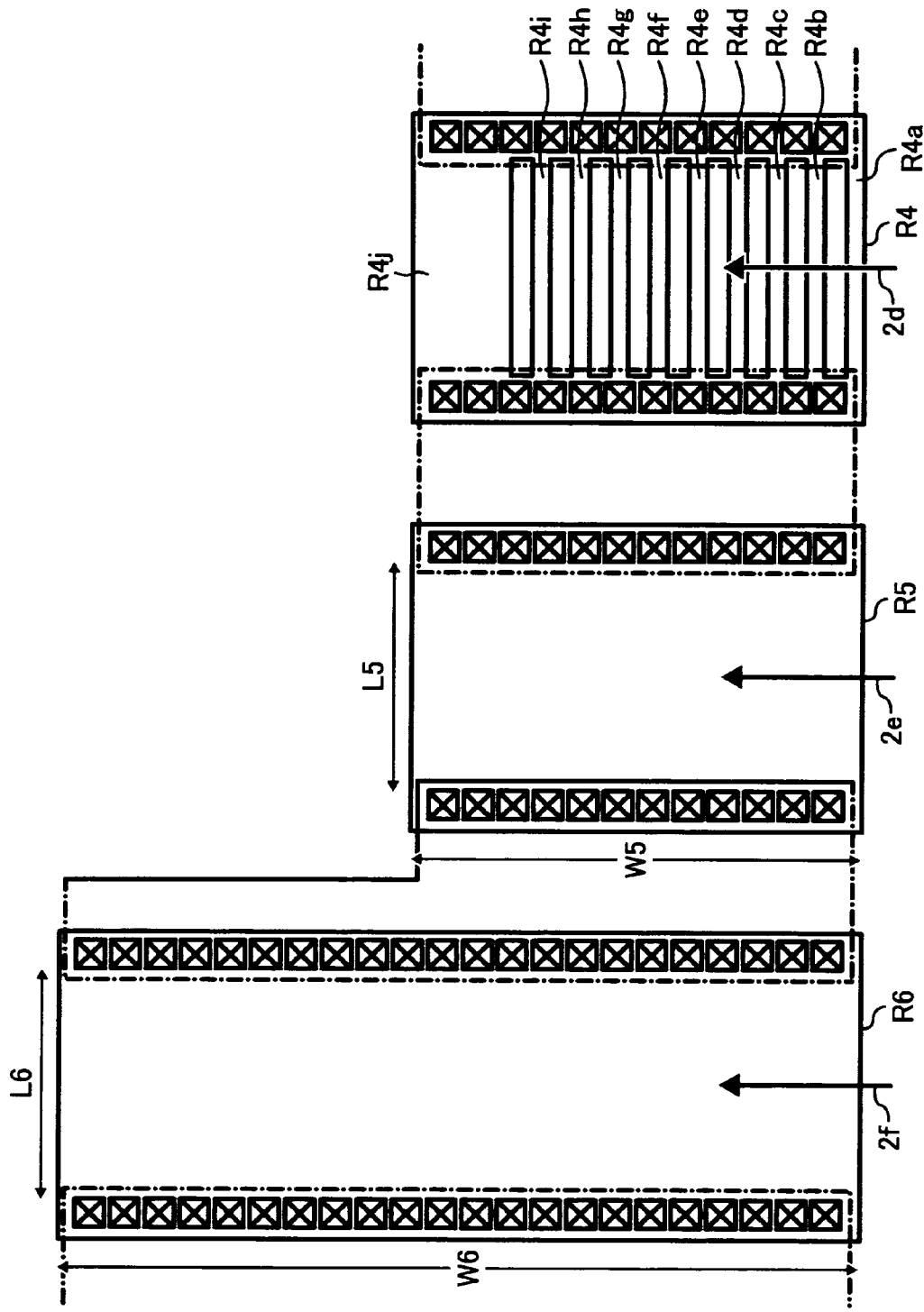
FIG. 2 is a diagrammatic plan view illustrating a resistance circuit according to another embodiment of the disclosure.

FIG. 2 is a diagrammatic plan view illustrating a resistance circuit according to another embodiment of this disclosure.

In this embodiment, a resistance circuit with a ten-bit digital trimming capability is described herein below, which is formed with three thin film metal resistors, having an initial resistance R0, a maximum adjusted resistance 2×R0, and a resistance adjustment accuracy of 1/1024 of R0.

Referring to FIG. 2, thin film metal resistors R4, R5, and R6 are formed each consisting substantially of CrSi, for example, on a silicon substrate with an intervening insulating layer therebetween. The thin film metal resistors are hereinafter referred to as "resistors."

The resistors R5, and R6 are formed as on-line trimming resistors of L5 and L6 in length (L5=L5=2 µm) and W5 and W6 in width (W5=40 µm, W6=80 µm), respectively.

The resistor R4 is formed as a ladder trimming resistor, including ten linear laser irradiation regions R4a, R4b, ..., R4j.

For each the laser irradiation regions R4a, R4b, ..., R4j, the length (L), width (W), and sheet resistance are shown in Table 1.

TABLE 1

| | LENGTH (µm) | WIDTH (µm) | SHEET RESISTANCE (Ω/□) |
|---|---|---|---|
| R4a | 43.5 | 4.80 | 9.06 |
| R4b | 43.5 | 3.63 | 12.0 |
| R4c | 43.5 | 2.85 | 15.3 |
| R4d | 43.5 | 2.29 | 19.0 |
| R4e | 43.5 | 1.88 | 23.1 |
| R4f | 43.5 | 1.58 | 27.6 |
| R4g | 43.5 | 1.34 | 32.5 |
| R4h | 43.5 | 1.15 | 37.8 |
| R4i | 43.5 | 1.00 | 43.5 |
| R4j | 35.8 | 14.2 | 53.05 |

An interlayer insulating layer is further formed over the structure including resistors R4, R5, and R6.

Contact holes are formed on the interlayer insulating layer corresponding to respective edge portions in the longitudinal direction of the resistors R4, R5, and R6.

In addition, a metal wiring layer is formed on the interlayer insulating layer including the regions in which the contact holes were formed, as designated by dashed dotted lines in FIG. 2, so that the resistors R4, R5, and R6 are connected in series by the metal wiring layer.

The resistors R4, R5, and R6 are subjected to laser irradiation as indicated by the arrows 2d, 2e, and 2f in FIG. 2, respectively.

Incidentally, the resistors R4, R5, and R6 correspond to the aforementioned resistors Ra, Rb, and Rc in the resistance circuit of the disclosure.

Also in the present embodiment the initial resistance R40 of the resistor R4 is obtained by the relational expression, $$1/R40=1/R4a+1/R4b+1/R4c+\ldots+1/R4j,$$

and the result is obtained as $R40=1.25\Omega/\square$.

Subsequently, a laser light is irradiated in the order of the laser irradiation regions in turn starting from R4a.

In the case when the region R4a is irradiated and disconnected as a result, the resistance R40a of the resistor R4 with the disconnected R4a is obtained by the relational expression, $$1/R40a=1/R4b+1/R4c+\ldots+1/R4j,$$

and the result is obtained as $R40a=1.65\Omega/\square$.

When the regions up to the region R4i are successively disconnected similarly by the laser irradiation, the resistance values R40a through R40i are obtained as, $R40b=1.65\Omega/\square$, $R40c=1.85\Omega/\square$, $R40d=2.05\Omega/\square$, $R40e=2.25\Omega/\square$, $R40f=2.45\Omega/\square$, $R40g=2.65\Omega/\square$, $R40h=2.85\Omega/\square$, and $R40i=3.05\Omega/\square$.

Thus, the resistor R4 has a resistance adjustment accuracy R4_step of $0.20\Omega/\square$.

Incidentally, the width W of laser irradiation regions R4a through R4i is set ranging from 1.00 to 4.80 μm so as to be disconnected by laser irradiation with relative ease.

In the next place, trimming characteristics of the resistor R5 will be explained in reference to FIG. 3.

Figure 3:
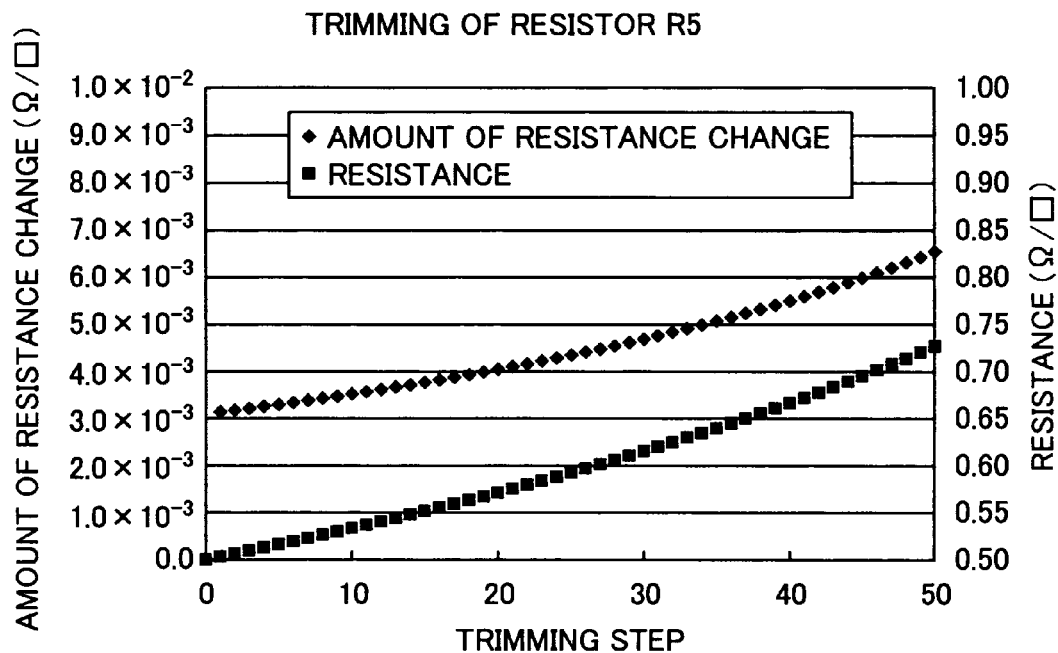
FIG. 3 illustrates the results obtained by simulating the trimming characteristics of the resistor R5, graphically plotting the magnitude of resistance change and resistance as a function of trimming step.

FIG. 3 illustrates the results obtained by simulating the trimming characteristics of the resistor R5, graphically plotting the magnitude of resistance change ($\Omega/\square$) and resistance ($\Omega/\square$) as a function of trimming step.

These results are obtained by setting irradiation conditions such as a laser spot diameter of 6 μm and a bite size of 0.5 μm (the distance of laser beam displacement per step).

It is indicated from the results of FIG. 3 that the magnitude of resistance change is in the range of $3.14\times10^{-3}$ to $6.55\times10^{-3}\Omega/\square$ and the initial resistance R50 can be adjusted ranging from 0.500 to $0.727\Omega/\square$.

Figure 4:
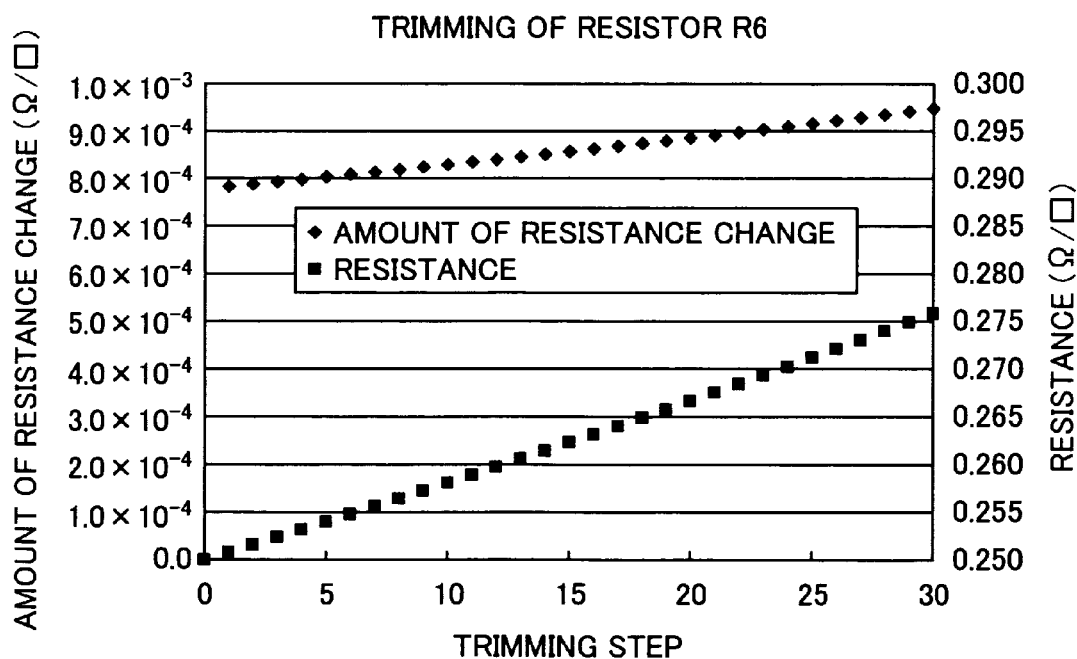
FIG. 4 illustrates the results obtained by simulating the trimming characteristics of the resistor R6, graphically plotting the magnitude of resistance change and resistance as a function of trimming step.

Trimming characteristics of the resistor R6 will be also described in reference to FIG. 4.

FIG. 4 illustrates the results obtained by simulating the trimming characteristics of the resistor R6, graphically plotting the magnitude of resistance change ($\Omega/\square$) and resistance ($\Omega/\square$) as a function of trimming step.

These results are obtained by setting irradiation conditions such as the laser spot diameter of 6 μm and the bite size of 0.5 μm.

It is indicated from the results of FIG. 4 that the magnitude of resistance change is in the range of $7.83\times10^{-4}$ to $9.48\times10^{-4}\Omega/\square$ and the initial resistance R60 can be adjusted ranging from 0.250 to $0.276\Omega/\square$.

On the basis of thus obtained initial resistances R40, R50, and R60 of the resistors R4, R5, and R6, respectively, the initial resistance R0 of the resistance circuit is herein set as $R0=R40+R50+R60=2.00$ ($\Omega/\square$). Moreover, the R0 value is used for the normalization of the resistance.

Figure 5A:
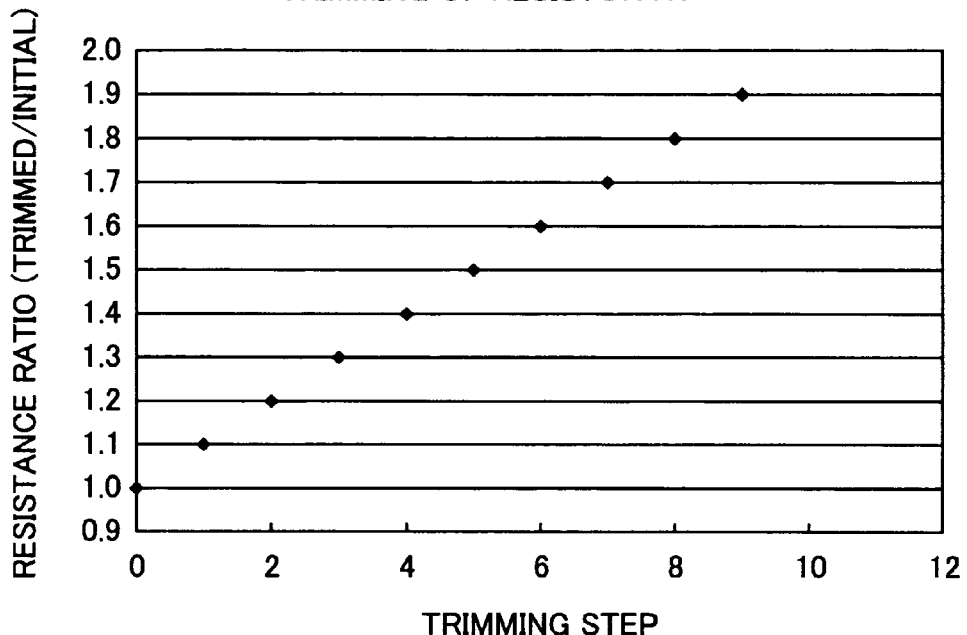
FIGS. 5A, 5B, and 5C each illustrate the results obtained by simulating the trimming characteristics of the resistors R4, R5, and R6, respectively, graphically plotting the ratio of resistance value (i.e., the ratio of trimmed to initial resistance) as a function of trimming step.
Figure 5B:
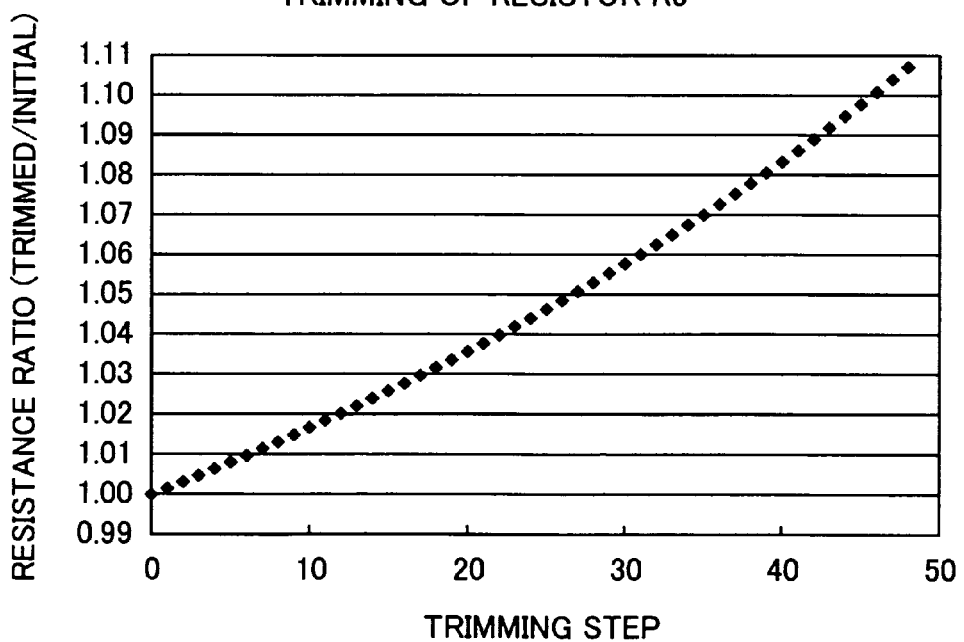
Figure 5C:
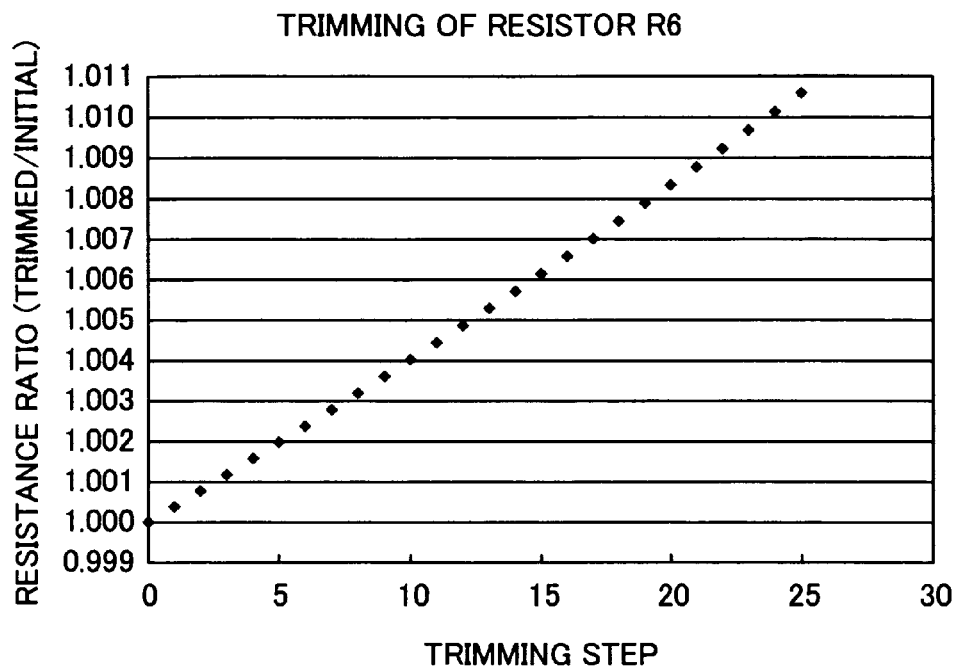

FIGS. 5A, 5B, and 5C each illustrate the results obtained by simulating the trimming characteristics of the resistors R4, R5, and R6, respectively, graphically plotting the ratio of resistance value (i.e., the ratio of trimmed to initial resistance) as a function of trimming step.

It is indicated from the results on the resistor R4 illustrated in FIG. 5A that the resistance can be adjusted in the range from $1\times R0$ to $1.9\times R0$ with the resistance adjustment accuracy of $0.1\times R0$.

It is also indicated from the results on the resistor R5 illustrated in FIG. 5B that the resistance can be adjusted in the range from $1\times R0$ to $1.100\times R0$ with the accuracy of $0.00305\times R0$.

Also indicated from the results on the resistor R6 illustrated in FIG. 5C is that the resistance can be adjusted in the range from $1\times R0$ to $1.010\times R0$ with the accuracy of $0.000455\times R0$.

Since the resistance adjustable range ΔR and resistance adjustment accuracy R_step are specified by the relation, initial resistance R0=total resistance adjustable range ΔR0, $$R4\_step=0.1\times\Delta R0 \quad (10),$$

$$\Delta R4=0.9\times\Delta R0 \quad (11),$$

$$R5\_step=0.00305\times\Delta R0 \quad (12),$$

$$\Delta R5=0.11\times\Delta R0 \quad (13),$$

$$R6\_step=0.000455\times\Delta R0 \quad (14), \text{ and}$$

$$\Delta R6=0.011\times\Delta R0 \quad (15).$$

As a result, (1) by means of the resistor R4, coarse adjustments of the order of 1/10 of the total resistance adjustable range ΔR0 is performed, (2) by the resistor R5, the adjustments of the order of $^{0.35}/_{100}$ (i.e., less than 1/100) of ΔR0 is performed, and (3) by the resistor R6, minute adjustments of the order of $^{0.455}/_{1000}$ (i.e., less than 1/1000) of ΔR0 is achieved.

Since resistance adjustment accuracy R_step of the resistors R5 and R6 has a trend of increase with trimming steps (FIGS. 5B and 5C), the R_step values corresponding to the maximum resistance adjustment accuracy (in the region of uniform increment) are adopted in the above relational expressions.

According to the expressions obtained as above for resistance circuits of the disclosure and the relations (10), (11), (12), (13), and (15), there obtained are $$\Delta R6=0.011\times\Delta R0 > R5\_step=0.00305\times\Delta R0, \text{ and}$$

$\Delta R5 = 0.11 \times \Delta R0 > R4\_step = 0.1 \times \Delta R0,$ and the relation, $\Delta Rn \geq R(n-1)\_step$, is fulfilled.

Also obtained are, from the relations (10), (12), and (14), $$R4\_step = 0.1 \times \Delta R0 \qquad (10),$$

$$R5\_step = 0.00305 \times \Delta R0 \qquad (12), \text{ and}$$

$$R6\_step = 0.000455 \times \Delta R0 \qquad (14).$$

In addition, the relations, $$Ra\_step \leq 0.1 \times \Delta R0,$$

$$Rb\_step \leq 0.01 \times \Delta R0 < Ra\_step, \text{ and}$$

$$Rc\_step \leq 0.001 \times \Delta R0 < Rb\_step,$$

are satisfied as well.

Therefore, the resistance of the resistance circuit can be adjusted in the range from $1 \times R0$ to $2.0 \times R0$ with the resistance adjustment accuracy of $^{0.455}/_{1000} \times R0$ by carrying out the resistance adjustment through laser trimming of the resistance circuit including three resistors R4, R5, and R6 connected in series. In addition, by performing the trimming steps online the resistance adjustment is feasible with a high accuracy over a wide range of resistance.

It is added that the area of resistance circuit is approximately 8000 μm² in the present embodiment, which can be reduced to 80% in area compared with the case of the 10-bit conventional digital trimming (Japanese Laid-Open Patent Application No. 2003-37179) considering additional effects of eliminating fuse elements.

As described herein above, an analog trimming resistor, which is subjected to a linear laser irradiation, is adopted as the resistor R1 is adapted as one for coarse resistance adjustment in the embodiment of FIG. 1, and a ladder trimming resistor is adopted as the resistor R4 in the embodiment of FIG. 2. However, the use of the resistors in the subject matter of the disclosure is not limited to the above examples.

Figure 6A:
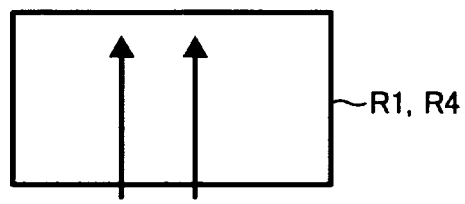
FIGS. 6A, 6B, and 6C are plan views each illustrating analog trimming resistors be used as the thin film metal resistor for the coarsest resistance adjustment, in which several patterns of laser irradiation can be selected such as the double-plunge, serpentine, and L-cut, respectively.
Figure 6B:
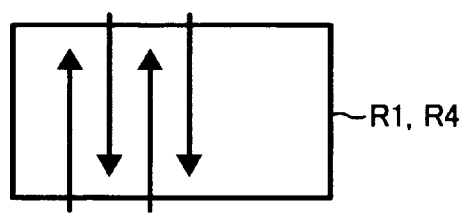
Figure 6C:
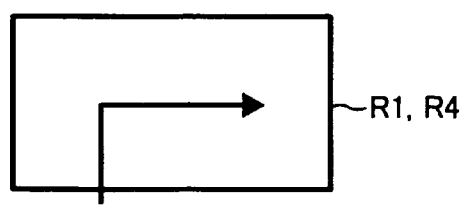

Namely, an analog trimming resistor may alternatively be used as the thin film metal resistor for the coarsest resistance adjustment, in which several patterns of laser irradiation can be selected such as the double-plunge of FIG. 6A, serpentine of FIG. 6B, and L-cut of FIG. 6C.

According to these patterns, the resistance adjustment can be feasible over a larger range of resistance value.

In addition, although the resistors in the embodiments are used as two groups of three resistors R1, R2, and R3, and R4, R5 and R6 each connected in series, the present disclosure is not limited to these examples, but four or more resistors may alternatively be used under the condition of satisfying the relation $\Delta Rn \geq R(n-1)\_step$.

Still in addition, although the two groups of resistors R1, R2, and R3, or R4, R5 and R6 in the embodiments are each connected in series and sequentially in the order of the adjustment accuracy from coarse to minute, the disclosure is not limited to the sequence described, but the resistors may alternatively be connected in an arbitrary order within the in-series connection.

The thin film metal resistors for forming semiconductor devices of the present disclosure are adoptable to a semiconductor apparatus provided with analog circuitry.

The semiconductor apparatus with analog circuitry using the thin film metal resistors will be described herein below.

Figure 7:
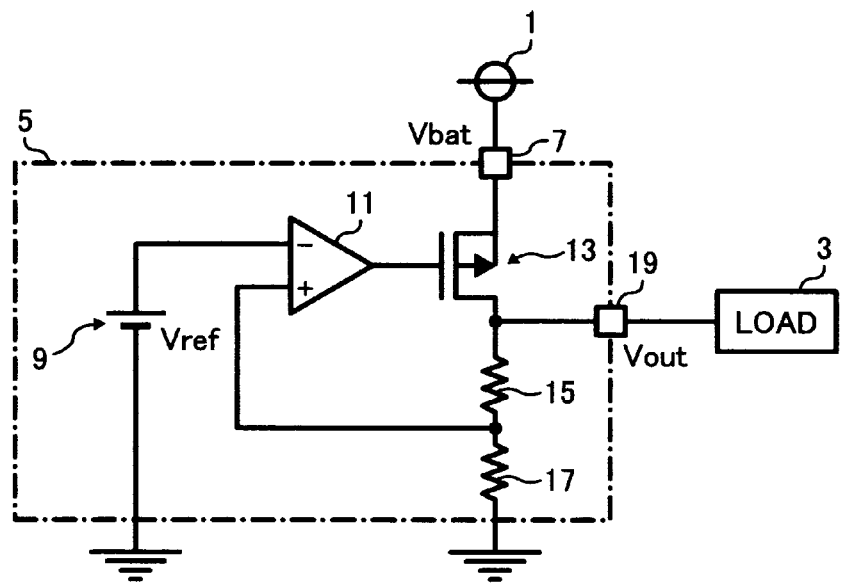
FIG. 7 is a diagrammatical circuit diagram illustrating a semiconductor apparatus including a constant voltage generating circuit as analog circuitry according to another embodiment of the present disclosure.

FIG. 7 is a diagrammatical circuit diagram illustrating a semiconductor apparatus including a constant voltage generating circuit as analog circuitry according to another embodiment of this disclosure.

Referring to FIG. 7, the constant voltage generating circuit 5 is formed to provide a stable power source to a load 3 from a DC (direct-current) power supply 1.

The constant voltage generating circuit 5 includes (1) an input terminal (Vbat) 7 to which the DC power source 1 is connected, (2) a reference voltage (Vref) generator 9, (3) an operational amplifier (comparison circuit) 11, (4) a P-channel MOS transistor 13 (which is hereinafter referred to as PMOS) to serve as an output driver, (5) a voltage dividing resistor circuit including resistors 15 and 17, and (6) an output terminal (Vout) 19.

In the operational amplifier 11 of the constant voltage generating circuit 5, the output terminal of the operational amplifier 11 is connected to the gate electrode of PMOS 13, the non-inverting terminal (−) thereof is applied with the reference voltage, Vref, from the reference voltage generator 9, and the inverting terminal thereof is input with the output voltage (Vout) divided by the resistors 15 and 17.

The constant voltage generating circuit 9 is therefore controlled to bring the voltage divided by the resistors, 15 and 17, to be equal to the reference voltage, Vref.

Figure 8:
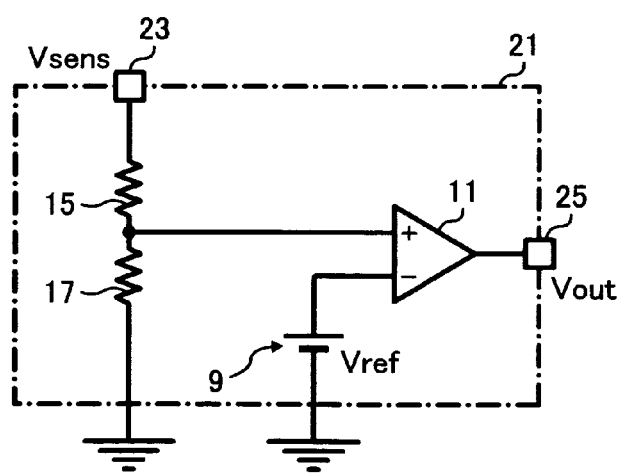
FIG. 8 is a diagrammatical circuit diagram illustrating another semiconductor apparatus including a voltage detecting circuit as analog circuitry according to still another embodiment of the present disclosure.

FIG. 8 is a diagrammatical circuit diagram illustrating another semiconductor apparatus including a voltage detecting circuit as analog circuitry according to still another embodiment of the disclosure.

In the voltage detecting circuit in reference to FIG. 8, an operational amplifier 11 is incorporated with the inverting terminal thereof which is connected by the reference voltage generating circuit 9 and applied by reference voltage Vref.

A terminal voltage, which is inputted from an input terminal (Vsens) 23 as the terminal voltage to be measured, is divided by the resistors 15 and 17, and subsequently inputted to the non-inverting terminal (+) of the operational amplifier 11.

Thereafter, the output of the amplifier 11 is sent to exterior by way of an output terminal (Vout) 25.

The voltage detecting circuit 21 is therefore operated such that the output level of the amplifier 11 remains H, if the above noted voltage Vsens is high enough to bring the voltage divided by the resistors, 15 and 17, to be higher than the reference voltage Vref. By contrast, the output level of the amplifier 11 turns to L, if the voltage Vsens decreases so as to bring the voltage divided by the resistors lower than the reference voltage Vref.

In the constant voltage generating circuit of FIG. 7 and the voltage detecting circuit of FIG. 8, there encountered in general is the scattering of reference voltage Vref as the output by the reference voltage generator, which is caused by the dispersion of working parameters during manufacturing process steps.

The alleviation of the scattering is achieved by including a dividing resistor circuit with adjustable resistance and by properly adjusting the resistance by disconnecting through laser irradiation onto resistors.

Figure 9:
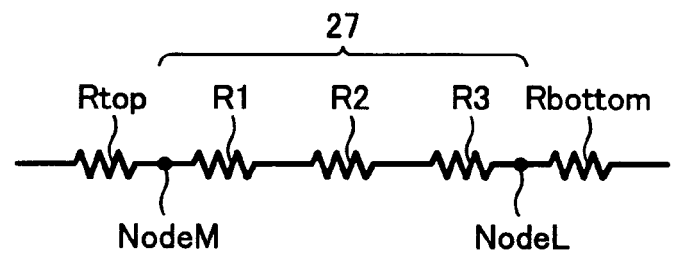
FIG. 9 is a diagrammatical diagram illustrating a dividing resistance circuit where the resistance circuits of the present disclosure can be applied.
Figure 10:
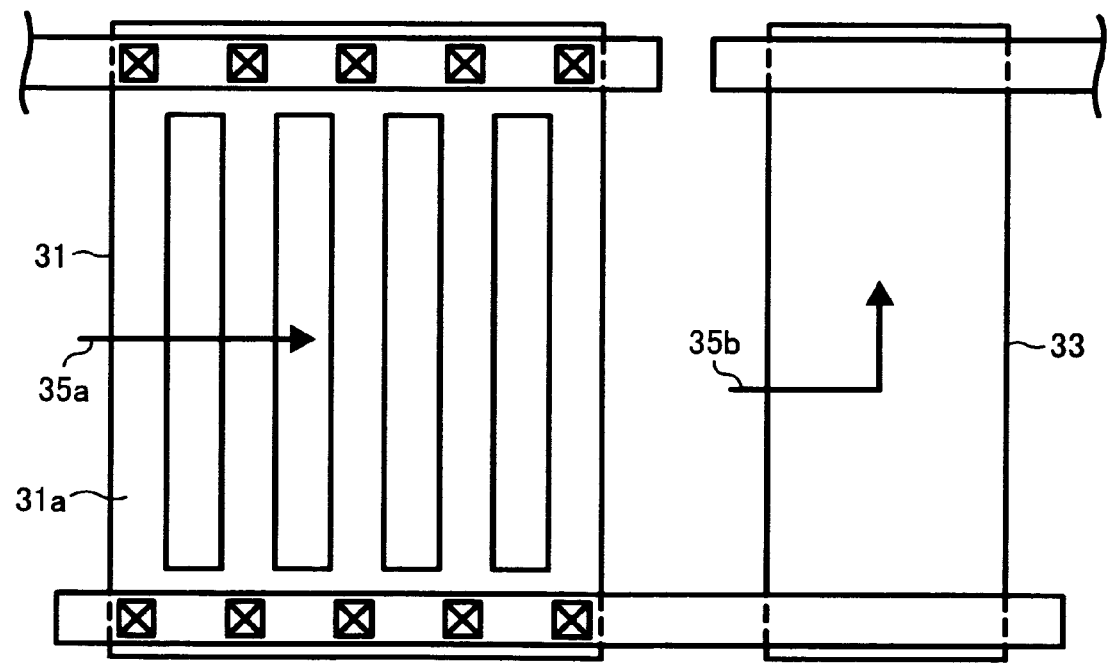
FIG. 10 is a plan view illustrating a known resistance circuit including a ladder trimming resistor and an analog trimming resistor in combination.
Figure 11A:
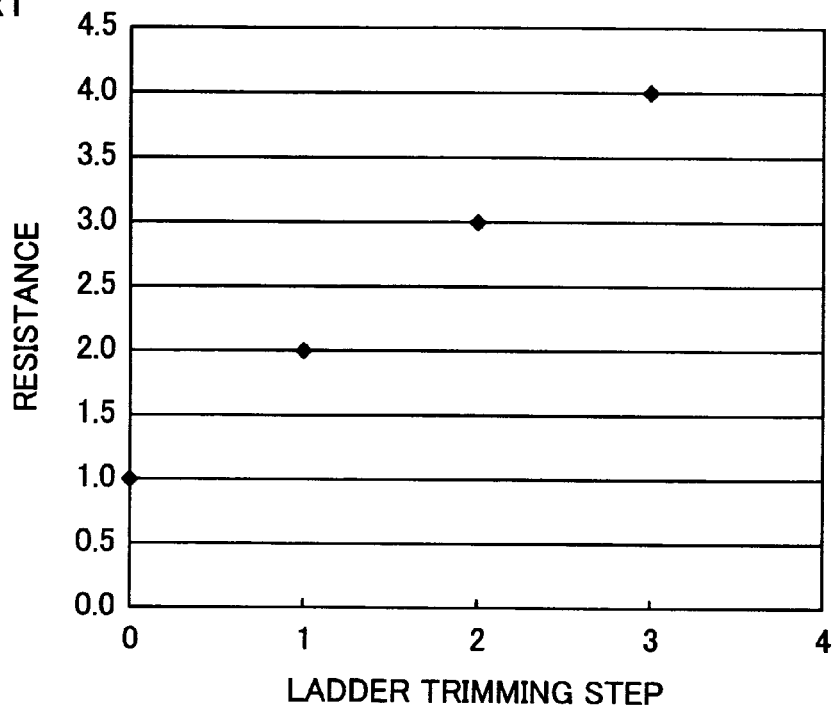
FIG. 11A is a graphical plot illustrating the results obtained by trimming the known resistance circuit of FIG. 10, graphically showing the resistance values as a function of trimming step after a coarse adjustment by trimming the ladder trimming resistor included in the resistor.
Figure 11B:
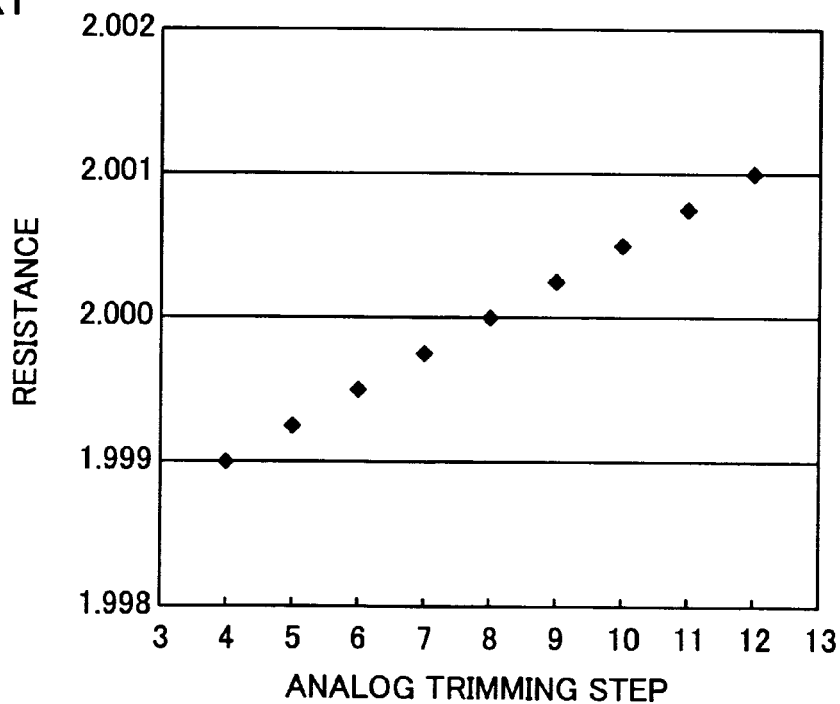
FIG. 11B is another graphical plot illustrating the results obtained by trimming the known resistance circuit of FIG. 10, graphically showing the resistance values after a high precision adjustment by trimming the analog trimming resistor included in the resistor over a partial region of FIG. 11A.
Figure 12:
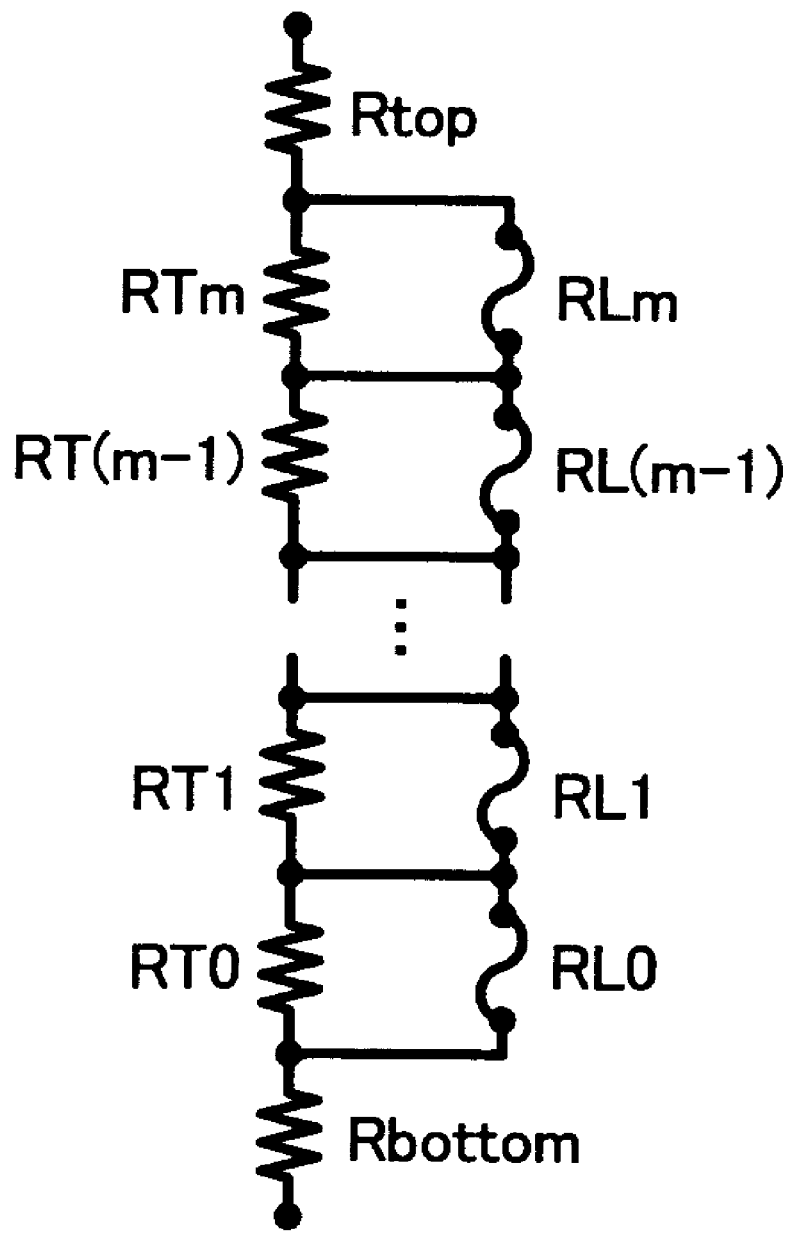
FIG. 12 is a diagrammatical diagram illustrating a known dividing resistance circuit including resistors accompanied by corresponding fuse elements connected in parallel with respect to the resistors.
Figure 13A:
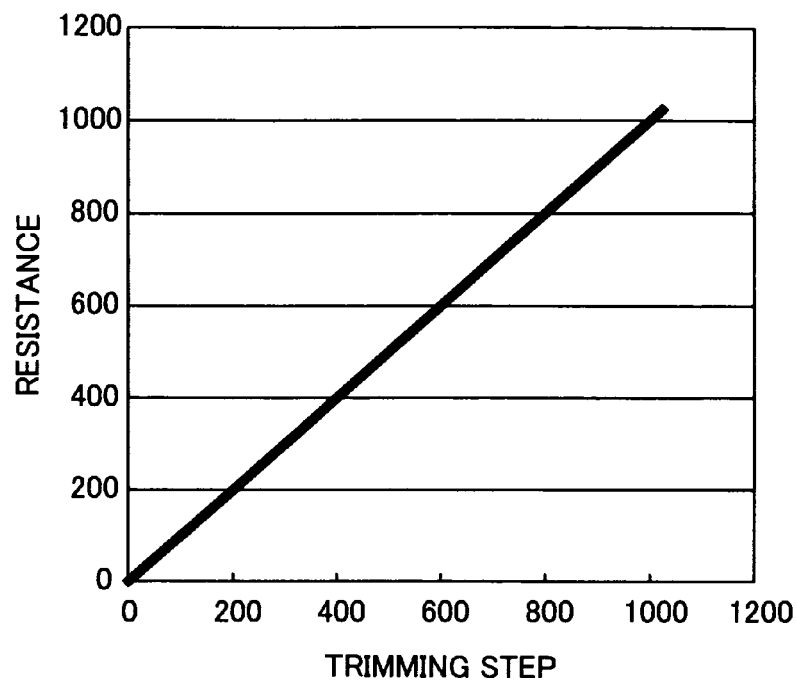
FIG. 13A is a graphical plot illustrating the overall change in resistance values as a function of the number of trimming step in the digital trimming of the dividing resistance circuit of FIG. 12.
Figure 13B:
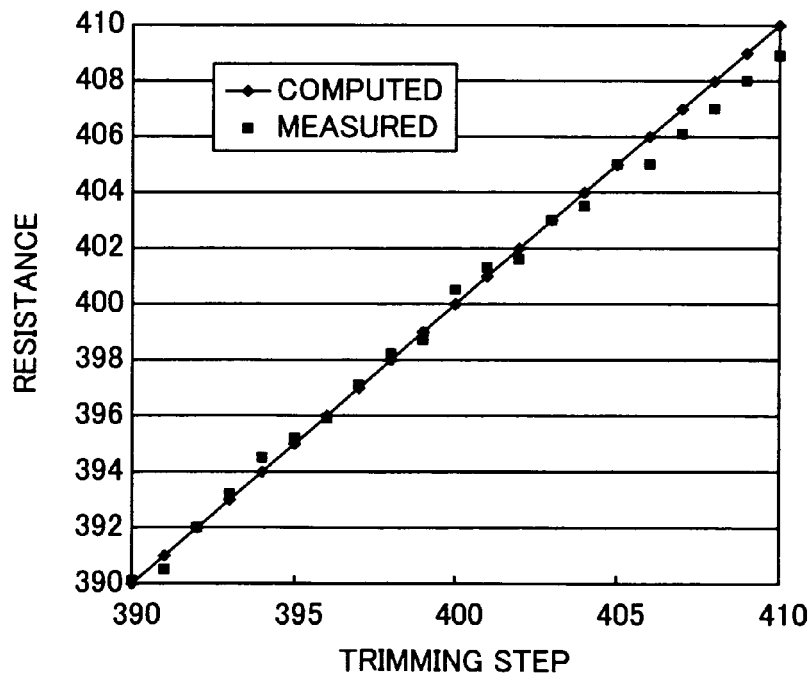
FIG. 13B is an expanded drawing for the portion of FIG. 13A ranging from the trimming steps 390 to 410 comparing the values obtained in practice with those obtained through computation.

FIG. 9 is a diagrammatical diagram illustrating a dividing resistance circuit where the resistance circuits of this disclosure can be applied.

Referring to FIG. 9, there connected in series are an Rbottom resistor, three resistors such as, for example, R1, R2, and R3 of FIG. 1, and an Rtop resistor. In such a dividing resistance circuit, it is possible to obtain a desired serial resistance value by disconnecting through laser beam irradiation performed onto the resistors R1, R2, and R3 (FIGS. 1 and 9).

For utilizing the dividing resistance circuit of FIG. 9 as the dividing resistance circuit 15 and 17 in the constant voltage generating circuit of FIG. 7, the end terminal of the resistance circuit on the Rbottom side is grounded and the other end terminal thereof on the Rtop side is connected to the drain of PMOS 13.

Moreover, either the junction terminal Node L formed between Rbottom and R3, or the junction terminal Node M formed between Rtop and R1, is connected to the non-inverting terminal of the operational amplifier 11.

In addition, for utilizing the dividing resistance circuit of FIG. 9 as the dividing resistance circuit 15 and 17 in the voltage detecting circuit of FIG. 8, the end terminal of the resistance circuit on the Rbottom side is grounded and the end terminal thereof on the Rtop side is connected to the input terminal 23.

Moreover, either the junction terminal Node L between Rbottom and R3, or the junction terminal Node M between Rtop and R1, is connected to the non-inverting terminal of the operational amplifier 11.

Although the illustrations herein above have been made in reference to FIGS. 7 through 9 on semiconductor apparatuses adaptable to the dividing resistance circuit using resistance circuits of the disclosure, the application thereof is not limited to semiconductor apparatuses provided with either the constant voltage generating circuit or the voltage detector circuit, but may also be applied to any apparatus incorporating a dividing resistance circuit, in general.

Moreover, the application of the resistance circuits of the disclosure is not limited to semiconductor apparatuses provided with a dividing resistance circuit, but may also be applied to any semiconductor device incorporating a thin film metal resistor.

It is apparent from the above description including the examples, the resistance circuits disclosed herein, and constant voltage generating and voltage detecting circuits incorporating such resistance circuits of the disclosure are advantageous over previously known similar circuits.

For example, the resistance circuit is provided in the disclosure with three or more thin film metal resistors connected in series, in which the plurality of resistors are formed so as to satisfy a relational expression, $\Delta Rn \geq R(n-1)\_step$. As a result, the resistance values can be adjusted continuously over a wide region in particular with high precision covering coarse adjustment regions.

In addition, the semiconductor apparatus is provided with three thin film metal resistors Ra, Rb, and Rc, as the abovementioned three or more thin film metal resistors connected in series, so as to satisfy the aforementioned relational expressions related to resistance adjustment accuracies Ra_step, Rb_step, and Rc_step, the resistance adjustment becomes feasible in the thin film metal resistors Ra, Rb, and Rc with the precision of less than $\frac{1}{100}$, $\frac{1}{100}$, and $\frac{1}{1000}$ of the total resistance adjustable range $\Delta R0$, respectively.

Still in addition, another semiconductor apparatus includes at least a dividing resistor circuit for generating an output voltage through voltage division by two or more thin film metal resistors and for adjusting the output voltage, in which the dividing resistor circuit includes one of the resistance circuits respectively comprising (a) three or more thin film metal resistors connected in series, and (b) three thin film metal resistors Ra, Rb, and Rc.

With this configuration of the resistance circuit, the resistance values can be adjusted with high precision over a wide range of resistance adjustment and the precision of the voltage output from the dividing resistor circuit is improved.

In addition, still another semiconductor apparatus includes at least a voltage detecting circuit provided with a dividing resistor circuit, a reference voltage generating circuit, and a comparison circuit.

Since the dividing resistor circuit includes one of the abovementioned resistance circuits, the precision of the voltage output from the dividing resistor circuit can be improved and the precision of voltage detecting capability with the voltage detecting circuit is also improved.

Moreover, another semiconductor apparatus includes at least a constant voltage generating circuit provided with an output driver, a dividing resistor circuit, a reference voltage generating circuit, and a comparison circuit.

Since the dividing resistor circuit includes one of the abovementioned resistance circuits, the precision of the voltage output from the dividing resistor circuit can be improved and the output voltage with the constant voltage generating circuit is thereby highly stabilized.

The constant voltage generation and voltage detection with high precision set forth in the present description may be implemented using conventional general purpose microprocessors, programmed according to the teachings in the present specification, as will be appreciated to those skilled in the relevant arts. Appropriate software coding can readily be prepared by skilled programmers based on the teachings of the present disclosure, as will also be apparent to those skilled in the relevant arts.

The present specification thus include also a computer-based product which may be hosted on a storage medium, and include instructions which can be used to program a microprocessor to perform a process in accordance with the present disclosure. This storage medium can include, but not limited to, any type of disc including floppy discs, optical discs, CD-ROMs, magneto-optical discs, ROMs, RAMs, EPROMs, EEPROMs, flash memory, magnetic or optical cards, or any type of media suitable for storing electronic instructions.

While the disclosure has been described in connection with the preferred embodiment, it will be understood that it is not intended to limit the disclosure to the embodiment. On the contrary, it is intended to cover such modifications or variations as may come within the scope of the following claims. For example, elements and/or features of different illustrative embodiments and/or examples may be combined with each other and/or substitute for each other within the scope of this disclosure and appended claims.

This application claims the priority of Japanese Patent Application No. 2005-286123, filed with the Japanese Patent Office on Sep. 30, 2005, the entire contents of which are hereby incorporated by reference.

What is claimed is:

1. A semiconductor apparatus including at least a resistance circuit, said resistance circuit being formed of a plurality of resistors connected in series such that a resistance of said plurality of resistors can be adjusted by one of disconnecting, and changing characteristic of, at least one of said plurality of resistors through a laser beam irradiation, said resistance circuit comprising:

three or more thin film metal resistors connected in series, wherein said plurality of resistors are formed so as to satisfy a relational expression, $\Delta Rn \geq R(n-1)\_step$, where $\Delta Rn$ is a resistance adjustable range for an n-th thin film metal resistor with n being an integer of two or greater, and $R(n-1)\_step$ is a resistance adjustment accuracy for an (n-1)th thin film metal resistor.

2. The semiconductor apparatus according to claim 1, wherein said three or more thin film metal resistors include a first thin film metal resistor Ra,
a second thin film metal resistor Rb, and
a third thin film metal resistor Rc, and
wherein said first, second, and third thin film metal resistors Ra, Rb, and Rc are formed so as to satisfy relational expressions, $Ra\_step \leq 0.1 \times \Delta R0$, $Rb\_step \leq 0.01 \times \Delta R0 < Ra\_step$, and $Rc\_step \leq 0.001 \times \Delta R0 < Rb\_step$, where Ra_step, Rb_step, and Rc_step are resistance adjustment accuracies for said first, second, and third thin film metal resistors Ra, Rb, and Rc, respectively, and $\Delta R0$ is a total resistance adjustable range specified by a relational expression, $\Delta R0 = \Delta Ra + \Delta Rb + \Delta Rc$, with $\Delta Ra$, $\Delta Rb$, and $\Delta Rc$ being resistance adjustable ranges for said first, second, and third thin film metal resistors Ra, Rb, and Rc, respectively.

3. The semiconductor apparatus according to claim 2, wherein said first, second, and third thin film metal resistors Ra, Rb, and Rc are each online trimming resistors.

4. The semiconductor apparatus according to claim 2, wherein said first thin film metal resistor Ra is a ladder trimming resistor, and said second and third thin film metal resistors Rb and Rc are each online trimming resistors.

5. The semiconductor apparatus according to claim 1, wherein said three or more thin film metal resistors are each online trimming resistors.

6. The semiconductor apparatus according to claim 1, wherein some of said three or more thin film metal resistors are ladder trimming resistors and others are online trimming resistors.

7. A semiconductor apparatus including at least a constant voltage generating circuit, said constant voltage generating circuit including a dividing resistor circuit configured to generate an output voltage through voltage division by two or more thin film metal resistors and to adjust the output voltage by irradiating a laser beam onto at least one of said thin film metal resistors;
said dividing resistor circuit including a resistance circuits comprising
three or more thin film metal resistors connected in series, wherein said plurality of resistors are formed so as to satisfy a relational expression, $\Delta Rn \geq R(n-1)\_step$, where $\Delta Rn$ is a resistance adjustable range for an n-th thin film metal resistor with n being an integer of two or greater, and $R(n-1)\_step$ is a resistance adjustment accuracy for an (n−1)th thin film metal resistor.

8. The semiconductor apparatus of claim 7 wherein said three or more thin film metal resistors include
a first thin film metal resistor Ra,
a second thin film metal resistor Rb, and
a third thin film metal resistor Rc, and
wherein said first, second, and third thin film metal resistors Ra, Rb, and Rc are formed so as to satisfy relational expressions, $Ra\_step \leq 0.1 \times \Delta R0$, $Rb\_step \leq 0.01 \times \Delta R0 < Ra\_step$, and $Rc\_step \leq 0.001 \times \Delta R0 < Rb\_step$, where Ra_step, Rb_step, and Rc_step are resistance adjustment accuracies for said first, second, and third thin film metal resistors Ra, Rb, and Rc, respectively, and $\Delta R0$ is a total resistance adjustable range specified by a relational expression, $\Delta R0 = \Delta Ra + \Delta Rb + \Delta Rc$, with $\Delta Ra$, $\Delta Rb$, and $\Delta Rc$ being resistance adjustable ranges for said first, second, and third thin film metal resistors Ra, Rb, and Rc, respectively.

9. The semiconductor apparatus according to claim 8, wherein said first, second, and third thin film metal resistors Ra, Rb, and Rc are each online trimming resistors.

10. The semiconductor apparatus according to claim 8, wherein said first thin film metal resistor Ra is a ladder trimming resistor, and said second and third thin film metal resistors Rb and Rc are each online trimming resistors.

11. A semiconductor apparatus including at least a voltage detecting circuit, said voltage detecting circuit including a dividing resistor circuit configured to generate a divided voltage by dividing an input voltage, a reference voltage generating circuit configured to supply a reference voltage, and a comparison circuit configured to make a comparison between the divided voltage generated by said dividing resistor circuit and the reference voltage supplied by said reference voltage generating circuit,
said dividing resistor circuit including a resistance circuit comprising
three or more thin film metal resistors connected in series, wherein said plurality of resistors are formed so as to satisfy a relational expression, $\Delta Rn \geq R(n-1)\_step$, where $\Delta Rn$ is a resistance adjustable range for an n-th thin film metal resistor with n being an integer of two or greater, and $R(n-1)\_step$ is a resistance adjustment accuracy for an (n−1)th thin film metal resistor.

12. The semiconductor apparatus of claim 11, wherein said three or more thin film metal resistors include
a first thin film metal resistor Ra,
a second thin film metal resistor Rb, and
a third thin film metal resistor Rc,
wherein said first, second, and third thin film metal resistors Ra, Rb, and Rc are formed so as to satisfy relational expressions, $Ra\_step \leq 0.1 \times \Delta R0$, $Rb\_step \leq 0.01 \times \Delta R0 < Ra\_step$, and $Rc\_step \leq 0.001 \times \Delta R0 < Rb\_step$, where Ra_step, Rb_step, and Rc_step are resistance adjustment accuracies for said first, second, and third thin film metal resistors Ra, Rb, and Rc, respectively, and $\Delta R0$ is a total resistance adjustable range specified by a relational expression, $\Delta R0 = \Delta Ra + \Delta Rb + \Delta Rc$, with $\Delta Ra$, $\Delta Rb$, and $\Delta Rc$ being resistance adjustable ranges for said first, second, and third thin film metal resistors Ra, Rb, and Rc, respectively.

13. The semiconductor apparatus according to claim 12, wherein said first, second, and third thin film metal resistors Ra, Rb, and Rc are each online trimming resistors.

14. The semiconductor apparatus according to claim 12, wherein said first thin film metal resistor Ra is a ladder trimming resistor, and said second and third thin film metal resistors Rb and Rc are each online trimming resistors.

15. A semiconductor apparatus including at least a constant voltage generating circuit, said constant voltage generating circuit including an output driver configured to control an output voltage corresponding to an input voltage, a dividing resistor circuit configured to supply a divided voltage by dividing the output voltage, a reference voltage generating circuit configured to supply a reference voltage, and a comparison circuit configured to make a comparison between the divided voltage generated by said dividing resistor circuit and the reference voltage supplied by said reference voltage generating circuit and to control an operation of said output driver according to a result of the comparison, said dividing resistor circuit including a resistance circuit comprising three or more thin film metal resistors connected in series, wherein said plurality of resistors are formed so as to satisfy a relational expression, $\Delta Rn \geq R(n-1)\_step$, where $\Delta Rn$ is a resistance adjustable range for an n-th thin film metal resistor with n being an integer of two or greater, and $R(n-1)\_step$ is a resistance adjustment accuracy for an (n−1)th thin film metal resistor.

16. The semiconductor apparatus of claim 15, wherein said three or more thin film metal resistors include a first thin film metal resistor Ra, a second thin film metal resistor Rb, and a third thin film metal resistor Rc, and wherein said first, second, and third thin film metal resistors Ra, Rb, and Rc are formed so as to satisfy relational expressions, $$Ra\_step \leq 0.1 \times \Delta R0,$$

$$Rb\_step \leq 0.01 \times \Delta R0 < Ra\_step, \text{ and}$$

$$Rc\_step \leq 0.001 \times \Delta R0 < Rb\_step,$$

where Ra_step, Rb_step, and Rc_step are resistance adjustment accuracies for said first, second, and third thin film metal resistors Ra, Rb, and Rc, respectively, and $\Delta R0$ is a total resistance adjustable range specified by a relational expression, $\Delta R0 = \Delta Ra + \Delta Rb + \Delta Rc$, with $\Delta Ra$, $\Delta Rb$, and $\Delta Rc$ being resistance adjustable ranges for said first, second, and third thin film metal resistors Ra, Rb, and Rc, respectively.

17. The semiconductor apparatus according to claim 16, wherein said first, second, and third thin film metal resistors Ra, Rb, and Rc are each online trimming resistors.

18. The semiconductor apparatus according to claim 16, wherein said first thin film metal resistor Ra is a ladder trimming resistor, and said second and third thin film metal resistors Rb and Rc are each online trimming resistors.

* * * * *